United States Patent [19]

Suzuki et al.

[11] Patent Number: 4,897,149

[45] Date of Patent: Jan. 30, 1990

[54] METHOD OF FABRICATING SINGLE-CRYSTAL SUBSTRATES OF SILICON CARBIDE

[75] Inventors: Akira Suzuki, Nara; Katsuki Furukawa, Sakai; Mitsuhiro Shigeta, Tenri, all of Japan

[73] Assignee: Sharp Kabushiki Kaisha, Osaka, Japan

[21] Appl. No.: 872,604

[22] Filed: Jun. 10, 1986

[30] Foreign Application Priority Data

Jun. 19, 1985 [JP] Japan .................................. 60-134721

[51] Int. Cl.$^4$ ............................................ C30B 25/20
[52] U.S. Cl. ...................................... 156/610; 156/612; 156/613; 156/614; 156/DIG. 64; 156/DIG. 99; 428/698
[58] Field of Search ............... 156/610, 612, 613, 614, 156/DIG. 64, DIG. 99; 428/698, 700; 427/93; 148/DIG. 148

[56] References Cited

U.S. PATENT DOCUMENTS

| | | | |
|---|---|---|---|
| 3,634,149 | 1/1972 | Knippenberg et al. | 156/614 |
| 3,960,619 | 6/1976 | Seiter | 156/610 |
| 4,028,149 | 6/1977 | Deines et al. | 156/612 |
| 4,147,572 | 4/1979 | Vodakov et al. | 156/610 |
| 4,161,743 | 7/1979 | Yanezawa et al. | 427/93 |
| 4,382,837 | 5/1983 | Rutz | 156/610 |

FOREIGN PATENT DOCUMENTS 887942 1/1962 United Kingdom .................. 427/93

OTHER PUBLICATIONS

"Growth of Silicon Carbide from Solution", the Marshall article from the *Material Research Bulletin*, vol. 4, pp. S73–S84 (1969).

"Growth Phenomena in Silicon Carbide", the Knippenberg article, Chapter 8, entitled "The Growth of Silicon Carbide by Recrystallization and Sublimation", pp. 244–266, vol. 18, No. 3.

Chapter of the Knippenberg article entitled "Preparative Procedures" at pp. 171–179.

*Primary Examiner*—John Doll
*Assistant Examiner*—Robert M. Kunemund
*Attorney, Agent, or Firm*—Sandler & Greenblum

[57] ABSTRACT

A single-crystal substrate of silicon carbide comprising a single-crystal substrate member of a material other than α-SiC, and a single-crystal layer of α-SiC formed over the substrate member with a ground layer provided between the substrate member and the single-crystal layer, the ground layer comprising a single-crystal layer of nitride of AlN, GaN or $Al_xGa_{1-x}N$ ($0<x<1$) having a hexagonal crystal structure or a crystal layer of the same structure made of a mixture of SiC and at least one of the nitrides; and a method for fabricating the same.

16 Claims, 2 Drawing Sheets

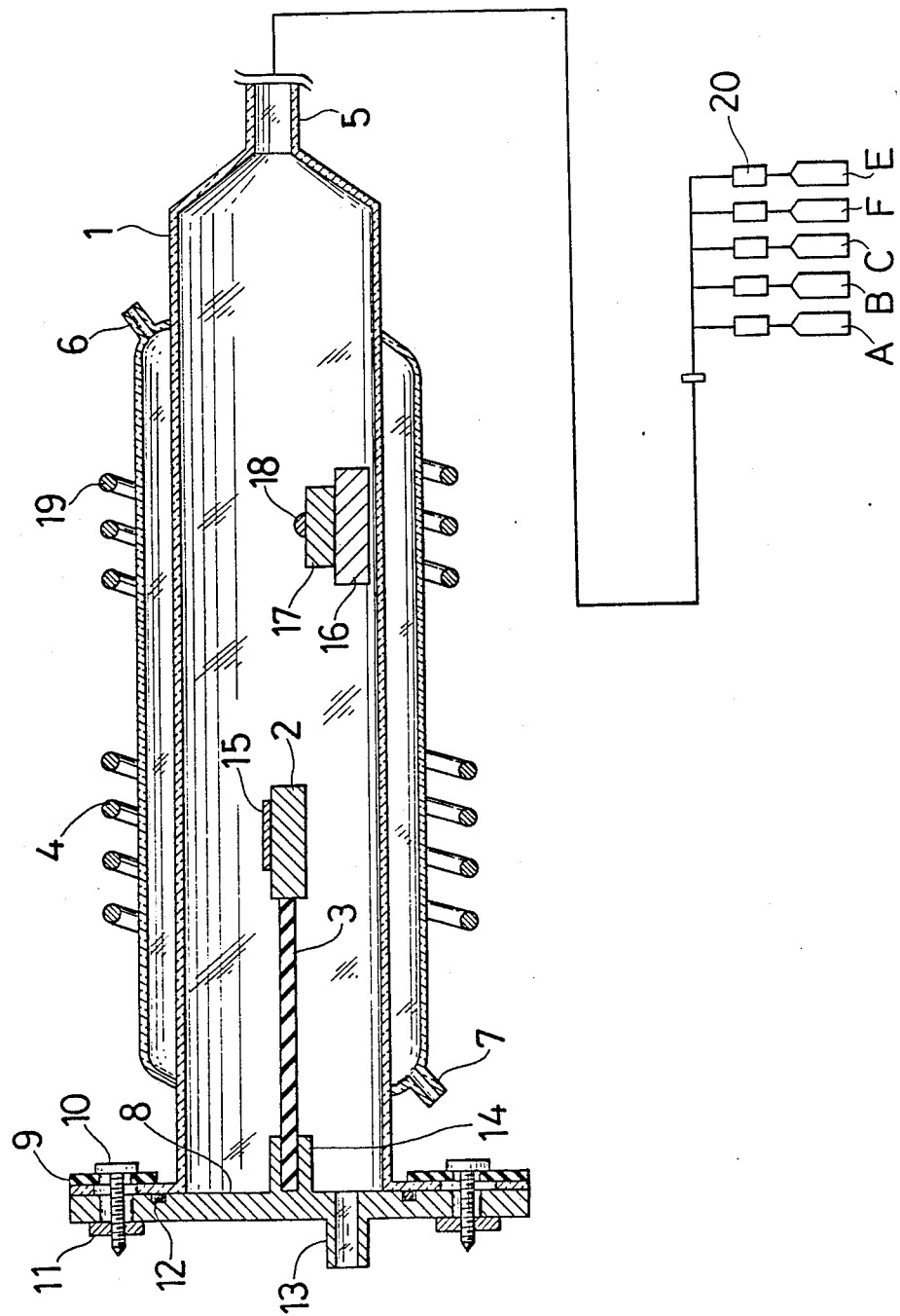

METHOD OF FABRICATING SINGLE-CRYSTAL SUBSTRATES OF SILICON CARBIDE

BACKGROUND OF THE INVENTION

1. Field of the Invention

The present invention relates to a method of fabricating novel single-crystal substrates of α-silicon carbide (α-SiC).

2. Description of the Prior Art

Silicon carbide is a semiconductor material having wide forbidden band gaps (2.2 to 3.3 eV) and exhibiting very stable properties thermally, chemically and mechanically and has the feature of being highly resistant to damage due to radiation. The material has both conductivities of the p-type and n-type, whereas this is seldom the case with semiconductors having wide forbidden band gaps. Accordingly silicon carbide appears useful as a semiconductor material for light-emitting or photodetector devices for visible lights of short wavelengths, for electronic devices operable at high temperatures or with high electric power, for highly reliable semiconductor devices and for radiation-resistant devices. Further silicon carbide will provide electronic devices which are usable in an environment where difficulties are encountered with devices made of conventional semiconductor materials, thus greatly enlarging the range of applications for semiconductor devices. Other semiconductor materials such as semiconductor compounds of elements from Groups II and VI or from Groups III and V generally contain a heavy metal as the main component and therefore have the problems of pollution and resources, whereas silicon carbide is free of these problems and accordingly appears to be a promising electronic material.

There are many crystal structures of silicon carbide (called "polytype") which are generally divided into the α-type and β-type. Silicon carbide of the β-type has a cubic crystal structure and is the smallest in forbidden band gaps (2.2 eV) of all forms of silicon carbide, while α-silicon carbide is of hexagonal or rhombohedral crystal structure and has relatively large forbidden band gaps of 2.9 to 3.3 eV. Because of the large forbidden band gaps, α-silicon carbide is expected to be a promising semiconductor material for optoelectronic devices, such as light-emitting devices and photodectectors, for use with blue and other visible lights of short wavelengths and near-ultraviolet rays. Although zinc sulfide (ZnS), zinc selenide (ZnSe), gallium nitride (GaN), etc. are materials which appear useful for light-emitting devices for blue or other visible lights of short wavelengths, the crystals of these materials usually available have conductivity of only one type, i.e. p-type or n-type, and difficulties are encountered in obtaining crystals having conductivity of both types. In contrast, α-silicon carbide readily provides a crystal of both p-type and n-type conductivities to afford a p-n junction. It is therefore expected that the material will realize light-emitting devices and photodetectors having outstanding optical characteristics or electrical characteristics. Further because of the exceedingly high stability in its thermal, chemical and mechanical properties, the material will be usable for wider applications than the other semiconductor materials.

Despite these many advantages and capabilities, α-silicon carbide has not been placed into actual use because the technique still remains to be established for growing α-silicon carbide crystals as controlled in size, shape and quality with good reproducibility, as required for the commercial mass production of silicon carbide substrates of large area with high quality and high productivity.

Conventional processes for preparing α-silicon carbide single-crystal substrates on a laboratory scale include the so-called sublimation method [also termed the "Lely method"; "Growth Phenomena in Silicon Carbide", W. F. Knippenberg: Phillips Research Reports, Vol. 18, No. 3, pp. 161–274 (1963). (Chapter 8, "The Growth of SiC by Recrystallization and Sublimation", pp. 244–266)] wherein silicon carbide powder is sublimed in a graphite crucible at 2,200° C. to 2,600° C. and recrystallized to obtain a silicon carbide substrate, the so-called liquid-phase method ["Growth of Silicon Carbide from Solution" R. C. Marshall: Material Research Bulletin, Vol. 4, pp. S73–S84 (1969)] wherein silicon or a mixture of silicon with iron, cobalt, platinum or like impurities is melted in a graphite crucible to obtain a silicon carbide substrate, and the Acheson method "Growth Phenomena in Silicon Carbide" W. F. Knippenberg: Philips Research Reports, Vol. 18, No. 3, pp. 161–274 (1963). (Chapter 2 "Preparative Procedures", pp. 171–179)] which is generally used for commercially producing abrasives and by which a silicon carbide substrate is obtained incidentally. Blue light-emitting diodes are fabricated using a substrate of α-silicon carbide obtained by such a crystal growth method, by forming on the substrate a single-crystal layer of α-silicon carbide by liquid-phase epitaxial growth (LPE) or chemical vapor deposition (CVD) to provide a p-n junction.

However, although the sublimation method or the liquid-phase method affords a large number of small single crystals, it is difficult to prepare large single-crystal substrates of good quality by these methods since many crystal nuclei occur in the initial stage of crystal growth. The silicon carbide substrate incidentally obtained by the Acheson method still remains to be improved in purity and crystal quality for use as a semiconductor material, while large substrates, if available, are obtained only incidentally. Thus, the conventional crystal growth methods for preparing substrates of α-silicon carbide have difficulties in controlling the size, shape, quality, impurities, etc. and are not suited to the commercial production of single-crystal substrates of silicon carbide in view of productivity. Although light-emitting diodes are produced by preparing substrates of α-silicon carbide by the conventional method and subjecting the substrates to liquid-phase epitaxy or chemical vapor deposition as already mentioned, no progress has been made in commercial mass production since there is no method of industrially preparing α-type single-crystal substrates having a large area and a high quality.

On the other hand, it is possible to epitaxially grow a single-crystal film of silicon carbide by CVD, LPE, molecular beam epitaxy (MBE) or like process on a single-crystal substrate of silicon (Si), sapphire (Al₂O₃), β-silicon carbide (β-SiC) or the like which differs from α-silicon carbide in component element or crystal structure, whereas the silicon carbide films obtained by this method are only of the β-type having a cubic crystal structure.

SUMMARY OF THE INVENTION

In view of the foregoing problems, we have carried out intensive research and consequently prepared a single-crystal substrate of silicon carbide by forming on a single-crystal substrate of a material other than α-silicon carbide a single-crystal layer of a specific substance having the same hexagonal crystal structure as α-SiC, and thereafter growing a single-crystal film of SiC on the layer. We have found that the single-crystal layer of α-SiC can be efficiently formed which takes over the crystal structure of the underlying substance.

Accordingly, the present invention provides a method of fabricating a single-crystal substrate of silicon carbide characterized by forming on a single-crystal substrate member of a material other than α-SiC a single-crystal layer of AlN, GaN or $Al_xGa_{1-x}N$ ($0<x<1$) having a hexagonal crystal structure or a crystal layer of the same structure made of a mixture of SiC and at least one of the nitrides as a ground layer, and growing a single crystal of α-SiC on the ground layer.

The present invention further provides a single-crystal substrate of silicon carbide comprising a single-crystal substrate member of a material other than α-SiC, and a single-crystal layer of α-SiC formed over the substrate member with a ground layer provided between the substrate member and the single-crystal layer, the ground layer comprising a single-crystal layer of AlN, GaN or $Al_xGa_{1-x}N$ ($1<x<1$) having a hexagonal crystal structure or a crystal layer of the same structure made of a mixture of SiC and at least one of the nitrides.

The present invention makes it possible to commercially fabricate a single-crystal substrate of α-silicon carbide having a high quality and a large area (e.g. 1 to 2 inches in diameter) with high productivity, opening the way for the actual use of these substrates as an optoelectronic device material for light-emitting devices, photodetectors, etc. for use with blue and other visible lights of short wavelengths and near-ultraviolet rays. It is further expected that the present single-crystal substrate of silicon carbide will find application in a wide variety of fields because of its high stability in thermal, chemical and mechanical properties.

BRIEF DESCRIPTION OF THE DRAWINGS

FIG. 2 is a diagram showing the construction of a growth apparatus used in Example 3 of the invention.

DESCRIPTION OF THE PREFERRED EMBODIMENTS

Figure 1:
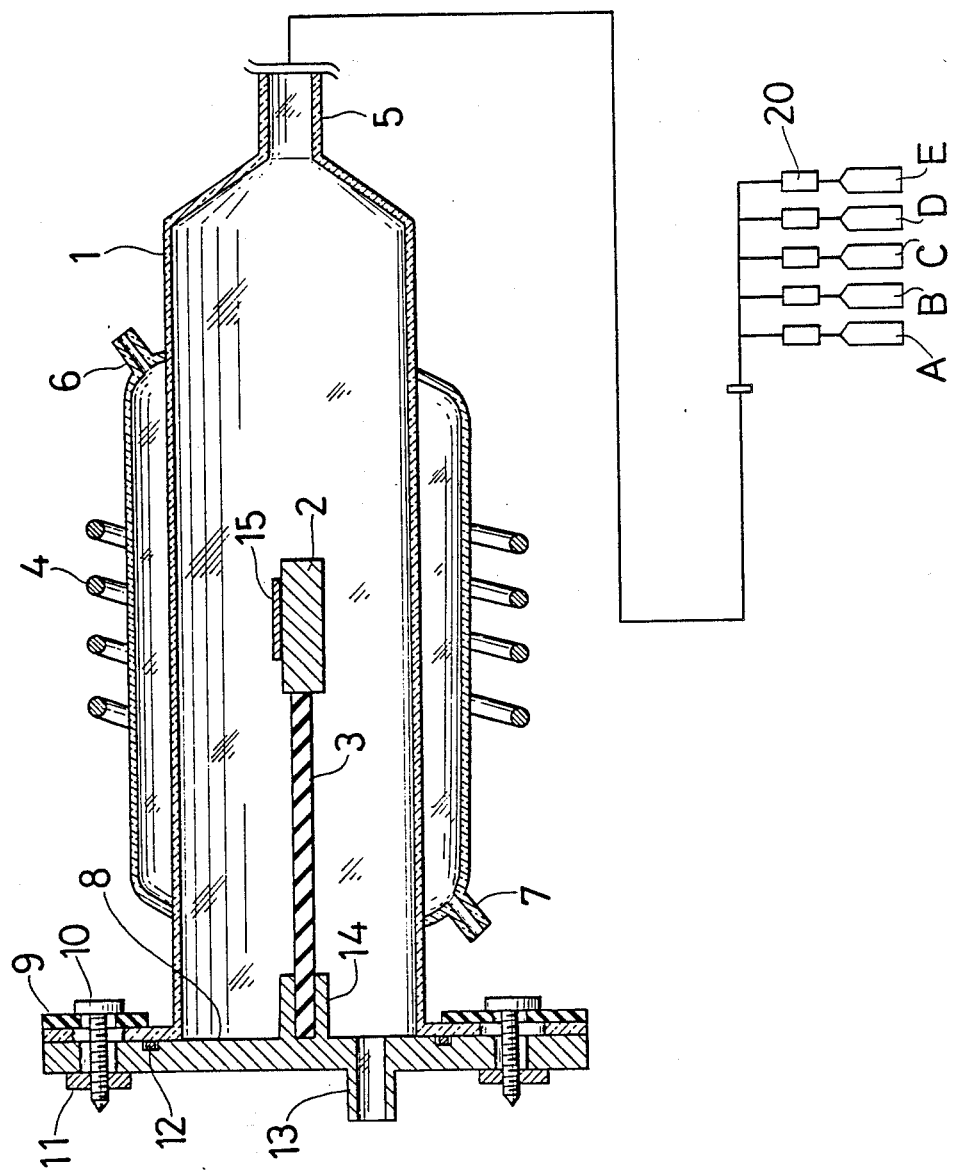
FIG. 1 is a diagram showing the construction of a growth apparatus used in Examples 1 and 2 of the present invention.

The term "single-crystal substrate member of a material other than α-SiC" as herein used means a single-crystal substrate of Si, $Al_2O_3$, β-SiC or the like. The single-crystal substrate of β-SiC is advantageous for preparing single crystals of good quality since it is similar to α-SiC in lattice constant and coefficient of thermal expansion. Usually, the single-crystal substrate of β-SiC may be in the form of a layer formed on some other base (for example, of Si single crystal). It is suitable that the single-crystal substrate member be about 1 to about 500 μm in thickness.

The ground layer of the present invention is in the form of a single-crystal layer of AlN, GaN or $Al_xGa_{1-x}N$ (($1<x<1$) or a crystal layer of a mixture of SiC and at least one of these nitrides. The crystal layer of the mixture suitably contains at least 0.1 mole %, e.g. about 1 to about 10 mole %, of AlN or the like. For example, satisfactory results can be achieved when a small amount, such as about 1 mole % or about 2 mole %, of AlN or the like is present.

It is thought that in the case of the crystal layer of a mixture of SiC and AlN or the like, Al, Ga and N atoms different from SiC are present in the form of a compound Al—N, Ga—N or $Al_xGa_{1-x}$—N, forming a crystal with SiC. However, such different atoms may be present in the crystal lattice of SiC as introduced therein locally and randomly as so-called dopants. Especially when the amounts of such atoms are small relative to SiC, these atoms will be present in the form of dopants.

The ground layer is formed most suitably by the CVD process. Examples of suitable Al sources for this process are the combination of metallic aluminum and an etching gas (e.g. hydrogen chloride gas) therefor, aluminum chloride, trimethylaluminum, triethylaluminum and the like. Examples of suitable Ga sources are the combination of metallic gallium and an ethching gas therefor, gallium chloride, trimethylgallium, triethylgallium and the like. Examples of suitable N sources are nitrogen, ammonia and the like. For forming the mixture crystal layer, suitable Si sources are $SiH_4$, $SiCl_4$, $SiH_2Cl_2$, $(CH_3)_3SiCl$, $(CH_3)_2SiCl_2$ and the like, and suitable C sources are $CCl_4$, $CH_4$, $C_2H_6$, $C_3H_8$. Such source gases are supplied to the reaction chamber for CVD usually as entrained in a carrier gas such as hydrogen gas. The rate of crystal growth of the ground layer and the ratio of constituent atoms of the crystal can be controlled as mentioned above by adjusting the flow rates of the source gases by mass flow controller or the like. The ratio of the source gases to be supplied in combination, e.g. Al—N source ratio, Ga—N source ratio or Al+Ga—N source ratio, may be such that an excess of one is used relative to the other. Although the supply ratio is preferably so determined that Al and N, for example, will be contained in the resulting crystal in the ratio of 1:1, the ratio need not always be set accurately; an excess of one element may be present in the crystal.

The CVD apparatus to be used can be one already known in the art. It is suitable that the substrate member be maintained at a temperature usually of 1000° to 1800° C., preferably 1200° to 1600° C. for CVD. The supplied gas pressure within the CVD chamber may be atmospheric or a low pressure of about 0.01 to about 100 torr. While it is suitable to form the ground layer to a thickness of at least 0.1 μm, especially about 0.1 to about 5 μm, the thickness may be larger.

The ground layer can be formed also by various processes for growing single crystals other than the CVD process, such as liquid-phase method, sublimation method, vacuum evaporation, MBE process, sputtering, etc. When the ground layer is formed, for example, by the liquid-phase method, metallic aluminum or metallic gallium and $Si_3N_4$ are used in addition to Si material at a growth temperature of 1500° to 1900° C. When the sublimation method is resorted to, metallic aluminum or metallic gallium and $Si_3N_4$ are admixed with SiC material.

A single crystal of SiC is grown on the ground layer thus obtained, whereby a single crystal of α-SiC is formed. Like the ground layer, the SiC single crystal is grown suitably by the CVD process, while the above-mentioned other processes may be used. While it is suitable to grow the single crystal to a thickness of about 1 to about 10 μm, the thickness can be larger.

The SiC single crystal grown on the ground layer is of the α-type presumably for the following reason.

α-SiC has various crystal structures which slightly differ from one another and typical of which are 2H form, 4H form and 6H form. AlN, GaN and $Al_x Ga_{1-x}N$ single crystals have exactly the same hexagonal crystal structure as α-SiC of 2H form. The lattice constants and coefficients of thermal expansion of these single crystals are 3.10 Å and $4.15 \times 10^{-6} K^{-1}$ for AlN, 3.19 Å and $5.59 \times 10^{-6} K^{-1}$ for GaN, and intermediate values between these values of AlN and GaN for $Al_x Ga_{1-x}N$ according to the ratio x. All of these values are approximate to the corresponding values of α-SiC, i.e. 3.08 Å and $4.2 \times 10^{-6} K^{-1}$. Further the crystal of a mixture of SiC with AlN, GaN or $Al_x Ga_{1-x}N$ also has the same hexagonal crystal structure as α-SiC of 2H form and is approximate to α-SiC in lattice constant and coefficient of thermal expansion. Accordingly, the SiC film grown is an α-crystal film taking over the crystal structure of the ground substance. From this viewpoint, use of AlN or the mixture of SiC and AlN is especially advantageous in obtaining a single crystal of α-SiC having good crystal quality since the material is very close to α-SiC in lattice constant and coefficient of thermal expansion.

The single-crystal substrate obtained is a novel one which itself has a specific layered structure. Moreover, the large band gaps of the ground layer serve to electrically separate the α-SiC single crystal from the substrate member. (The ground layer acts also as an insulating film since AlN, for example, has band gaps of 6.2 eV, or the mixture crystal of AlN and SiC has band gaps of at least 3.3 eV.) These features render the α-SiC single crystal usable for devices with a great advantage.

The present invention will be described in greater detail with reference to the following examples in which crystals were grown by the CVD process on substrate members of β-SiC single crystal. In Example 1, an AlN single-crystal layer was grown first on the substrate member, and an α-SiC single-crystal film was then grown on the layer. In Examples 2 and 3, a crystal layer of a mixture of AlN and SiC was grown first on the substrate member, and an α-SiC single-crystal film was then grown on the layer.

The substrate members of β-SiC single crystal were prepared by the successive two-step CVD process already proposed by the present applicant for growing β-SiC single crystals (Unexamined Japanese Patent Publication SHO No. 59-203799). Stated more specifically, the substrate member was prepared by uniformly forming a thin polycrystalline SiC layer, about 20 nm in thickness, on an Si single-crystal base at a temperature of about 1050° C. by CVD using $SiH_4$ and $C_3H_8$ as source gases, growing an SiC single-crystal film, about 20 μm in thickness, on the layer at a temperature of about 1350° C. by CVD using $SiH_4$ and $C_3H_8$ and dissolving away the Si of the base with an acid mixture of HF and $HNO_3$. The substrate members of β-SiC single crystal used were 1 cm×1 cm in size.

The accompanying drawings are diagrams showing the CVD growth apparatus used in Examples 1 to 3. The apparatus of FIG. 1 was used for Examples 1 and 2, and the apparatus of FIG. 2 for Example 3. With reference to FIGS. 1 and 2, a water-cooled double-walled horizontal quartz reaction tube 1 has in its interior a graphite susceptor 2 supported by a graphite bar 3. A high-frequency current is passed through a working coil 4 wound around the body of the reaction tube 1 to heat the graphite susceptor 2 by induction. The apparatus of FIG. 2 has another graphite susceptor 17 as supported by a pedestal 16. The susceptor 17 is heated by induction with a high-frequency current passed through a working coil 19. One end of the reaction tube 1 has a branch pipe 5 serving as a gas inlet. Cooling water is passed through the outer quartz tube of the reaction tube 1 via branch pipes 6 and 7. The other end of the reaction tube 1 is sealed off by a stainless steel flange 8, retaining plate 9, bolts 10, nuts 11 and an O-ring 12. The flange 8 has a branch pipe 13 serving as a gas outlet. The graphite bar 3 is fixed to a holder 14. A substrate member of β-SiC single crystal is placed on the susceptor 2. In FIG. 2, metallic aluminum 18 is placed on the susceptor 17. The source gases and carrier gas ($H_2$) have their flow rates controlled by mass flow controllers 20. Indicated at A to F are gas cylinders; A for $H_2$, B for $SiH_4$, C for $C_3H_8$, D for $(CH_3)_3Al$, E for $N_2$, and F for HCl.

EXAMPLE 1

The apparatus of FIG. 1 was used.

The air within the reaction tube 1 was replaced by hydrogen gas, and a high-frequency current was passed through the working coil 4 to heat the susceptor 2 and maintain the substrate member 15 of β-SiC at a temperature of about 1300° C.

Nitrogen ($N_2$) gas supplied at a flow rate of 0.75 liter/min and trimethylaluminum ($(CH_3)_3Al$) gas at 0.6 c.c./min were admixed with hydrogen carrier gas at a flow rate of 1.5 liters/min, and the mixture was fed to the reaction tube 1 through the branch pipe 5 to grow AlN for 2 hours, whereby an AlN single-crystal layer was formed with a thickness of about 0.6 μm. Subsequently, with the supply of the hydrogen carrier gas and the heating of the substrate member continued but with the supply of the nitrogen gas and trimethylaluminum gas discontinued, propane ($C_3H_8$) and monosilane ($SiH_4$) were fed to the reaction tube 1 via the branch pipe 5 at flow rates of 0.045 c.c./min and 0.045 c.c./min, respectively, to grow a crystal for 1 hour. Consequently, an SiC film of about 1 μm in thickness was formed over the AlN layer on the β-SiC substrate member.

The crystal structure of the SiC film grown was analyzed by reflection high-energy electron diffraction (RHEED) using an electron beam at an accelerating voltage of 50 kV. The analysis indicated spots corresponding to the reciprocal lattice points of 2H-form crystal. Thus, the crystal obtained was identified as an α-SiC single crystal of 2H form.

EXAMPLE 2

The apparatus of FIG. 1 was used.

The air within the reaction tube 1 was replaced by hydrogen gas, and a high-frequency current was passed through the working coil 4 to heat the susceptor 2 and maintain the substrate member 15 of β-SiC at a temperature of about 1400° C.

Propane, monosilane, nitrogen and trimethylaluminum supplied as source gases at flow rates of 0.25 c.c./min, 0.75 c.c./min, 0.35 c.c./min and 0.60 c.c./min, respectively, were admixed with hydrogen carrier gas at a flow rate of 3 liters/min, and the gas mixture was fed to the reaction tube 1 via the branch pipe 5 to grow a crystal for 30 minutes, whereby a crystal layer of mixture of AlN and SiC was obtained with a thickness of about 3 μm.

Reflection high-energy electron diffraction (RHEED) analysis revealed that the layer had the crystal structure of 2H form. The layer was further subjected to Auger electron spectroscopy analysis in a high vacuum of $1 \times 10^{-9}$ torr using electron beam at an accelerating voltage of 5 kV after removing an oxide film or the like from the surface of the Ar ion sputtering. The relative intensity ratio between the peaks ($Si_{LVV}$, $Si_{KLL}$, $C_{KLL}$, $N_{KLL}$, $Al_{KLL}$) indicated that the layer was a mixture crystal of about 1% AlN and about 99% of SiC.

Subsequently, SiC was grown on the layer by continuing the supply of hydrogen carrier gas, propane gas and monosilane gas and heating of the substrate member, with the supply of nitrogen gas and trimethylaluminum gas discontinued. In 30 minutes, a film of about 3 μm in thickness was obtained on the crystal layer of mixture of AlN and SiC on the β-SiC substrate member. Reflection high-energy diffraction analysis revealed that the layer was an β-SiC single crystal of 2H form.

EXAMPLE 3

The apparatus of FIG. 2 was used.

The air within the reaction tube 1 was replaced by hydrogen gas, and a high-frequency current was passed through the working coil 4 to heat the susceptor 2 and maintain the substrate member 15 of β-SiC at a temperature of about 1500° C. A high-frequency current was then passed through the working coil 15 to heat the susceptor 17 to a temperature of about 800° C. and melt aluminum 18.

Propane ($C_3H_8$), monosilane ($SiH_4$) and nitrogen supplied as source gases at flow rates of 0.25 c.c./min, 0.75 c.c./min and 0.2 liter/min, respectively, and hydrogen chloride (HCl) supplied as an etching gas for the molten aluminum at a flow rate of 5 c.c./min were admixed with hydrogen carrier gas at a flow rate of 1 liter/min, and the mixture was supplied to the reaction tube 1 through the branch pipe 5. The molten aluminum was etched by the hydrogen chloride gas, released into the carrier gas and transported onto the β-SiC substrate member. Consequently, a crystal layer of mixture of AlN and SiC was formed in 30 minutes with a thickness of about 2 μm. Reflection high-energy electron diffraction analysis revealed that the layer had the crystal structure of 2H form. Auger analysis showed that the crystal was composed of about 1% of AlN and about 99% of SiC.

Subsequently, a crystal was grown by continuing the supply of hydrogen carrier gas, propane gas and monosilane gas and the heating of the substrate member, with the supply of nitrogen gas and hydrogen chloride gas discontinued. Consequently, an SiC film of about 2 μm in thickness was formed in 30 minutes on the crystal layer of AlN-SiC mixture over the β-SiC substrate member. Reflection high-energy electron diffraction analysis revealed that the SiC film grown was an α-SiC single crystal of 2H form.

What we claim is:

1. A method of fabricating a single-crystal substrate of silicon carbide comprising:
   (a) forming a crystal substrate base layer selected from the group consisting of:
      (i) a single-crystal substrate ground layer of a nitride selected from the group consisting of AlN, GaN and $Al_x Ga_{1-x}N$ wherein $0<x<1$, said single crystal substrate ground layer having a hexagonal crystal structure, and
      (ii) a crystal layer of the same structure comprising a mixture of SiC and at least one of said nitrides present in an amount within the range of 0.1–10 mole % by total weight of said mixture on a single crystal substrate of a material selected from a group of materials not including alpha-SiC at a temperature from 1,200 to 1,600° C. by a CVD method; and
   (b) growing a single crystal of alpha-SiC on said ground layer.

2. A method as defined in claim 1 wherein the crystal layer of the mixture contains at least about 1–10 mole percent of a nitride selected from the group consisting AlN, GaN and $Al_x Ga_{1-x}N$.

3. A method as defined in claim 1 wherein the crystal layer of the mixture contains about 1 mole % of AlN.

4. A method as defined in claim 1 wherein the ground layer comprises a single-crystal layer of AlN.

5. A method as defined in claim 1 wherein the ground layer and the single crystal of α-SiC are formed and grown by CVD.

6. A method as defined in claim 1 wherein the ground layer is formed to a thickness of 0.1 to 5 μm, and the single crystal of α-SiC is grown to a thickness of 1 to 10 μm.

7. A method as defined in claim 1 wherein the single-crystal substrate member consists essentially of a single crystal selected from the group consisting of Si, $Al_2O_3$ and beta-SiC.

8. A method as defined in claim 1 wherein the single-crystal substrate member consists essentially of a single crystal of beta-SiC.

9. A method as defined in claim 1 wherein the single-crystal substrate member has a thickness of 1 to 500 μm.

10. A single-crystal substrate of silicon carbide comprising:
   (a) a single crystal substrate member of a material selected from a group of materials not including alpha-SiC;
   (b) a ground layer selected from the group consisting of
      (i) a single crystal layer of a nitride selected from the group consisting of AlN, GaN, and $Al_x Ga_{1-x}N$ wherein, said single crystal substrate group layer having a hexagonal crystal structure; and
      (ii) a single crystal layer of the same structure comprising a mixture of SiC and at least one of said nitrides present in an amount within the range of 0.1–10% mole % by total weight of said mixture, said ground layer being formed over said substrate member at a temperature from 1,000° C. to 1,800° C. by a CVD method; and
   (c) a single-crystal of alpha-SiC grown on said ground layer.

11. A substrate as defined in claim 10 wherein the crystal layer of the mixture contains at least 1–10 mole % of a nitride selected from the group consisting of AlN, GaN, and $Al_x Ga_{1-x}N$.

12. A substrate as defined in claim 10 wherein the crystal layer of the mixture contains about 1 mole % of AlN.

13. A substrate as defined in claim 10 wherein the ground layer comprises a single-crystal layer of AlN.

14. A substrate as defined in claim 10 wherein the ground layer has a thickness of 0.1 to 5 μm, and the single-crystal layer of α-SiC has a thickness of 1 to 10 μm.

15. A substrate as defined in claim 10 wherein the single-crystal substrate member consists essentially of a single crystal selected from the group consisting of SiAl₂O₃ and beta-SiC.

16. A substrate as defined in claim 10 wherein the single-crystal substrate member has a thickness of 1 to 500 μm.

* * * * *

UNITED STATES PATENT AND TRADEMARK OFFICE
CERTIFICATE OF CORRECTION

PATENT NO. : 4,897,149

DATED : January 30, 1990

INVENTOR(S) : Akira SUZUKI et al.

It is certified that error appears in the above-identified patent and that said Letters Patent is hereby corrected as shown below:

At column 1, line 46, change "photodectectors" to ---photodetectors---;

column 3, line 30, change "1< <1" to ---$0<$ $<1$---;

column 3, line 68, change "1< <1" to ---0< <1---;

column 4, line 22, change "ethching" to ---etching---;

column 7, line 67 (i.e., in claim 1, line 7), change "Aln" to ---AlN---; and column 10, line 2 (i.e., claim 15, line 4), change "$SiAl_2O_3$" to ---$Si,Al_2O_3$---.

Signed and Sealed this

Twenty-fifth Day of June, 1991

*Attest:*

*Attesting Officer*

HARRY F. MANBECK, JR.

*Commissioner of Patents and Trademarks*